United States Patent
Bakshi et al.

(10) Patent No.: US 7,709,816 B2
(45) Date of Patent: May 4, 2010

(54) SYSTEMS AND METHODS FOR MONITORING AND CONTROLLING THE OPERATION OF EXTREME ULTRAVIOLET (EUV) LIGHT SOURCES USED IN SEMICONDUCTOR FABRICATION

(75) Inventors: Vivek Bakshi, Austin, TX (US); Stefan Wurm, Austin, TX (US); Kevin Kemp, Austin, TX (US)

(73) Assignees: Sematech, Inc., Austin, TX (US); Freescale, Austin, TX (US); Infineon Technologies, Munich (DE)

( * ) Notice: Subject to any disclaimer, the term of this patent is extended or adjusted under 35 U.S.C. 154(b) by 428 days.

(21) Appl. No.: 11/839,819

(22) Filed: Aug. 16, 2007

(65) Prior Publication Data

US 2009/0046273 A1 Feb. 19, 2009

(51) Int. Cl.
*G21K 5/00* (2006.01)
(52) U.S. Cl. ............ 250/492.2; 250/492.1; 250/504 R; 250/372; 355/67; 355/68; 356/213; 356/218
(58) Field of Classification Search ............... 250/336.1, 250/365, 370.01, 372, 492.1, 492.2, 504 R; 355/67, 68; 356/213, 218
See application file for complete search history.

(56) References Cited

U.S. PATENT DOCUMENTS

| | | | |
|---|---|---|---|
| 6,781,135 B2 * | 8/2004 | Berger | 250/372 |
| 6,822,251 B1 | 11/2004 | Arenberg et al. | 250/504 R |
| 6,894,285 B2 * | 5/2005 | Kleinschmidt et al. | 250/372 |
| 6,998,620 B2 * | 2/2006 | Schriever | 250/372 |
| 7,141,798 B2 * | 11/2006 | Ito et al. | 250/372 |
| 7,154,101 B2 * | 12/2006 | Panning | 250/372 |
| 7,473,907 B2 * | 1/2009 | Singer et al. | 250/492.2 |
| 2003/0058429 A1 * | 3/2003 | Schriever | 355/133 |
| 2006/0160031 A1 | 7/2006 | Wurm et al. | 430/322 |
| 2009/0059196 A1 * | 3/2009 | Bakshi et al. | 355/67 |

* cited by examiner

*Primary Examiner*—David A Vanore
*Assistant Examiner*—Michael Maskell
(74) *Attorney, Agent, or Firm*—Fulbright & Jaworski L.L.P.

(57) ABSTRACT

Systems and methods for monitoring and controlling the operation of extreme ultraviolet (EUV) sources used in semiconductor fabrication are disclosed. A method comprises providing a semiconductor fabrication apparatus having a light source that emits in-band and out-of-band radiation, taking a first out-of-band radiation measurement, taking a second out-of-band radiation measurement, and controlling the in-band radiation of the light source, at least in part, based upon a comparison of the first and second out-of-band measurements. An apparatus comprises a detector operable to detect out-of-band EUV radiation emitted by an EUV plasma source, a spectrometer coupled to the electromagnetic detector and operable to measure at least one out-of-band radiation parameter based upon the detected out-of-band EUV radiation, and a controller coupled to the spectrometer and operable to monitor and control the operation of the EUV plasma source based upon the out-of-band measurements.

19 Claims, 4 Drawing Sheets

SYSTEMS AND METHODS FOR MONITORING AND CONTROLLING THE OPERATION OF EXTREME ULTRAVIOLET (EUV) LIGHT SOURCES USED IN SEMICONDUCTOR FABRICATION

BACKGROUND OF THE INVENTION

1. Field of the Invention

The present invention relates to semiconductor fabrication, and more particularly to systems and methods for monitoring and controlling the operation of extreme ultraviolet (EUV) light sources used in semiconductor fabrication.

2. Description of Related Art

Semiconductor fabrication typically involves dozens, or even hundreds of individual operations. In general terms, these operations can be classified as: layering, patterning, doping, and heat treatments. Among these, patterning (also referred to as "lithography") is considered to be the most critical operation because it sets the physical dimensions of the resulting devices on the semiconductor wafer.

Patterning comprises a series of steps by which selected portions of material deposited on the wafer surface are removed, thus leaving a "pattern" thereon. The sequence of steps may be described as follows. First, a pattern is formed on a photomask or reticle—e.g., a glass or quartz plate having a thin layer of chrome thereon. Then, the photomask is imaged or printed onto a layer of photoresist deposited on the wafer. Etching agents remove portions of the wafer not covered by the photoresist, and the photoresist itself is removed in subsequent steps. The transfer of the pattern from the photomask onto the photoresist is performed using some form of light source or electromagnetic radiation.

The wavelength of the light source used during the lithography process is directly proportional to the size of the features that can ultimately be fabricated on the semiconductor wafer. Hence, the continuous desire to create increasingly small semiconductor devices has created a need for light sources capable of emitting very short wavelength radiation. One such light source is the Extreme Ultraviolet (EUV) plasma source. EUV radiation may be generated in the 13.5 nm wavelength range by a plasma-based process whereby a fuel material such as xenon, lithium, indium, tin, etc. is heated to high temperatures. This intense heat may be achieved through the use of a focused laser beam, plasma pinch electrodes applying high-energy, short-duration pulses, or the like.

Light produced by EUV sources provides a printing resolution in the order of nanometers. Extremely small features down to 25 nm have been satisfactorily imaged. It is, however, very difficult to monitor the performance of these sources. U.S. Patent Application Publication No. 2003/0058429 discloses an apparatus that attempts to measure the energy of an EUV photon system. The apparatus is designed to detect the in-band power of a pulsed or continuous source—i. e., at a wavelength between 11 and 15 nm—and filtering out the out-of-band radiation by several orders of magnitude.

The inventors hereof have recognized several significant drawbacks with existing EUV monitoring systems such as the one referred to above. First, multi-layer mirrors used in these systems quickly lose their reflectivity over time and frequently need to undergo expensive and time consuming calibration procedures, thus decreasing the overall productivity. Moreover, existing EUV systems must perform measurements in a high vacuum, which further adds to the cost and complexity of the system.

The shortcomings mentioned above are not intended to be exhaustive, but rather are among many that tend to impair the effectiveness of previously known techniques for monitoring energy from EUV sources. The problems listed above are sufficient to demonstrate that the methodologies appearing in the art have not been satisfactory, and that a significant need exists for the systems and methods described and claimed herein.

BRIEF SUMMARY OF THE INVENTION

The present invention provides systems and methods for monitoring and controlling the operation of light sources used in semiconductor fabrication. In one embodiment, a method comprises providing a semiconductor fabrication apparatus having a light source that emits in-band and out-of-band radiation, taking a first out-of-band radiation measurement, taking a second out-of-band radiation measurement, and controlling the in-band radiation of the light source, at least in part, based upon a comparison of the first and second out-of-band measurements.

In another embodiment, an apparatus comprises an electromagnetic detector operable to detect out-of-band EUV radiation emitted by an EUV plasma source, a spectrometer coupled to the electromagnetic detector and operable to measure at least one out-of-band radiation parameter based upon the out-of-band EUV radiation detected by the electromagnetic detector, and a controller coupled to the spectrometer and operable to monitor and control the operation of the plasma based EUV sources upon the at least one out-of-band radiation parameter measured by the spectrometer.

In yet another embodiment, a computer readable medium has a computer program recorded thereon that causes a computer to perform the steps of monitoring a first out-of-band radiation parameter collected from a first point of a light source apparatus used in a semiconductor fabrication process, monitoring a second out-of-band radiation parameter collected from a second point of the light source apparatus, and controlling an in-band output of the light source, at least in part, based upon a comparison of first and second out-of-band radiation parameters.

The term "coupled" is defined as connected, although not necessarily directly, and not necessarily mechanically. The terms "a" and "an" are defined as one or more unless this disclosure explicitly requires otherwise. The terms "substantially," "approximately," "about," and variations thereof are defined as being largely but not necessarily wholly what is specified, as understood by a person of ordinary skill in the art. In one non-limiting embodiment, the term substantially refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways other than those specifically described herein.

BRIEF DESCRIPTION OF THE SEVERAL VIEWS OF THE DRAWINGS

For a more complete understanding of the present invention, reference is now made to the following drawings, in which.

DETAILED DESCRIPTION OF THE INVENTION

Figure 1:
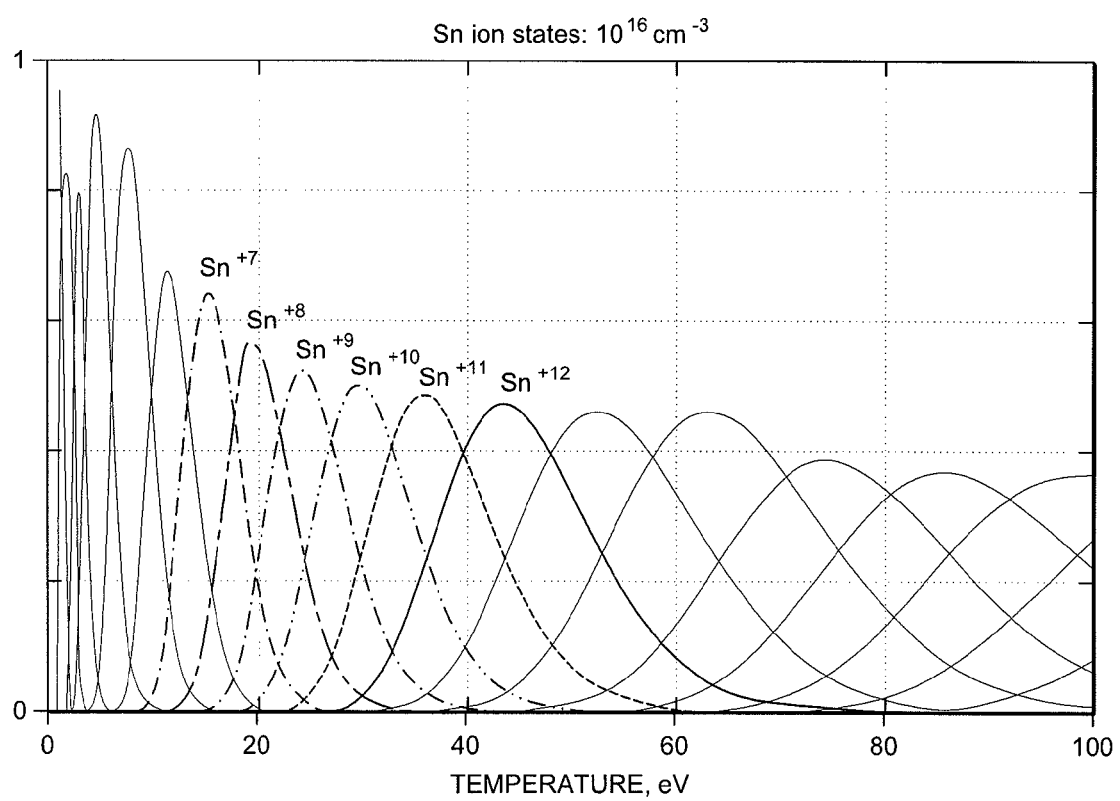
FIG. 1 is a graph of electron-density versus temperature for ionic species of a tin (Sn) plasma source that radiates in both in- and out-of-band EUV radiation.

In the following detailed description, reference is made to the accompanying drawings that illustrate embodiments of the present invention. These embodiments are described in sufficient detail to enable a person of ordinary skill in the art to practice the invention without undue experimentation. It should be understood, however, that the embodiments and examples described herein are given by way of illustration only, and not by way of limitation. Various substitutions, modifications, additions, and rearrangements may be made without departing from the spirit of the present invention. Therefore, the description that follows is not to be taken in a limited sense, and the scope of the present invention is defined only by the appended claims.

The present invention provides systems and methods for monitoring and controlling the operation of EUV sources used in semiconductor fabrication. Typical EUV sources operate by application of a large electrical field and/or high-energy laser to a fuel material such Xe, Li, In, Sn, etc. This causes the material to reach temperatures of about 30-40 eV (where 1 eV=11,604 K) by magnetic compression, laser-target interaction, or the like. At this point, the fuel material emits electromagnetic radiation and debris. The debris may include undesirable high energy ions and electrons, and may be treated using any appropriate mitigation mechanism.

With respect to the emitted electromagnetic radiation, EUV sources are often designed to generate light having wavelengths in the range of approximately 1 to 30 nm, and, more specifically at approximately 13.5 nm. This is the so-called "in-band" EUV radiation. Due to practical limitations, however, EUV sources also radiate energy in other portions of the spectrum—e.g., ultraviolet, visible, infrared, etc. When used in a lithography operation of semiconductor fabrication, this "out-of-band" EUV radiation is usually filtered out so that only (or mostly) in-band EUV radiation is used to image photomasks onto photoresists.

To better illustrate typical radiation patterns of EUV light sources, Table I below shows the measured radiation power distribution from a tin laser-produced plasma (Sn LPP) source across various spectral bands (from the EUV spectrum to the far infrared (IR) spectrum):

TABLE I

Measured radiation power for an Sn LPP source across spectral bands

| SPECTRAL BANDS | POWER (mJ/2π sr) |
| --- | --- |
| In-band EUV (~1-30 nm) | 1.5 |
| Out of Band (~160 to 325 nm) | 0.0 |
| Out of Band (~325 to 715 nm) | 0.15 |
| Out of Band (~715 to 850 nm) | 0.04 |
| Out of Band (~850+ nm) | 0.15 |

It may be seen that, although most of the energy is emitted in-band (~1.5 mJ/2π sr), a significant portion of it is out-of-band. A similar conclusion may be reached from examination of Table II below, showing the measured radiation power from a discharge produced plasma (DPP) based EUV source, using xenon as fuel:

TABLE II

Measured radiation power for an a Xe GDPP source across spectral bands

| SPECTRAL BANDS | POWER (mJ/2π sr) |
| --- | --- |
| In-band EUV (~1-30 nm) | 3.7 |
| Out of Band (~160 to 325 nm) | 0.55 |
| Out of Band (~325 to 715 nm) | 0.25 |
| Out of Band (~715 to 850 nm) | 0.15 |
| Out of Band (~850+ nm) | 0.29 |

In light of the foregoing, the inventors hereof have discovered that in-band radiation parameters of an EUV source may be estimated and tuned using out-of-band metrology. In fact, out-of-band EUV radiation has proven to be highly correlated with in-band EUV radiation, which would be unexpected by a person of ordinary skill in the art. Therefore, measurements may be made in areas of the spectrum other than the EUV band to resolve, for instance, the power and/or power stability of an EUV source in the actual EUV band. The use of longer, out-of band wavelength radiation—e.g., ultraviolet, visible, and/or infrared—allows one to monitor and control EUV sources while overcoming the prior art problems previously discussed.

In one embodiment, natural transitions of fuel elements—e.g., Xe, Li, In, Sn, etc.—that radiate outside the main EUV band may be used to determine in-band EUV power. In another embodiment, impurities such as tracer atoms may be added to the plasma fuel in a controlled manner to provide suitable transitions in- and/or out-of-band such that monitoring may occur once their respective states are excited. By monitoring the radiation emitted in those transitions along with the temperature of the plasma, EUV power level and stability may be controlled.

Figure 2:
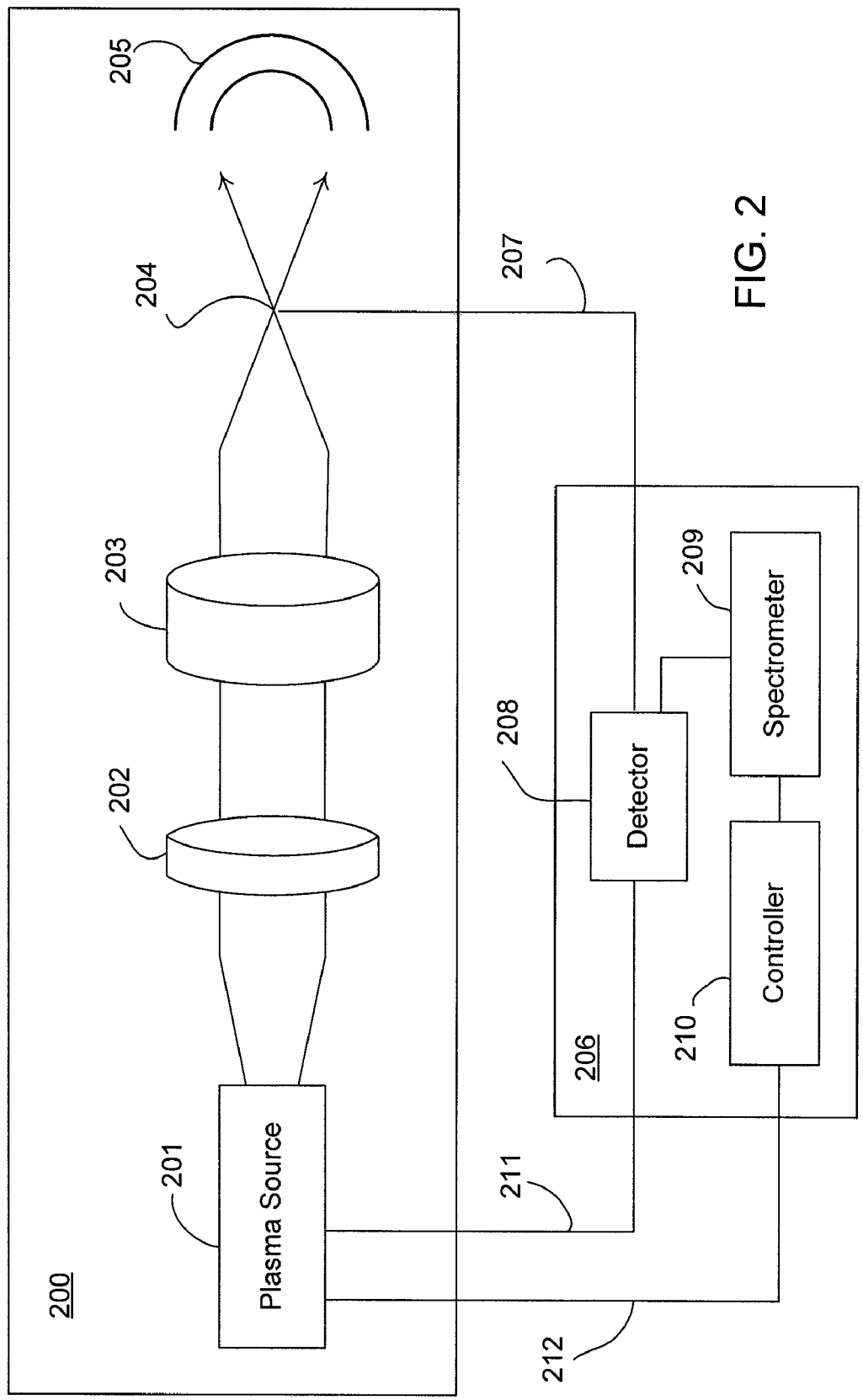
FIG. 2 is a block diagram of a system for monitoring and controlling the in-band operation of extreme ultraviolet (EUV) light sources using out-of-band metrology according to one embodiment of the present invention.

Referring to FIG. 1, a graph of electron-density versus temperature for ionic species of a tin (Sn) plasma source that radiates in both in- and out-of-band with respect to the EUV spectrum is depicted. The ordinate provides theoretical electron-density values (in the order of about $1e^{16}$ cm$^{-3}$), whereas the abscissa represents the theoretical temperature values (in electronic volts, eV) of the various predicted ionic states of the material. As illustrated in FIG. 2, ionic species Sn 5+ and 12+ are responsible for generating in-band EUV radiation, and maximization of those states result in the increase of EUV output. By monitoring the density of the various stages and using this information to optimize the EUV output, the conversion efficiency (CE) of the EUV source may be increased.

In order to monitor in-band EUV radiation of a plasma source, a qualitative relationship may be established between EUV source power and source power stability at out-of-band EUV transitions. Widely used methods to determine plasma properties include, for example, transition line-ratio, transition line-to-continuum ratio, absolute intensity measurement, and transition line broadening. These methods are also applicable to out-of-band EUV radiation measurements. As such, measurement of out-of-band EUV transitions may be used to estimate plasma properties, which may in turn be used to predict the conversion efficiency and monitor and control the operation of the EUV generating plasma source.

Turning now to FIG. 2, a block diagram of a system for monitoring and controlling the operation of an EUV light source using out-of-band metrology is depicted according to one illustrative embodiment of the present invention. Semiconductor fabrication apparatus (e.g., a lithography projection exposure machine) 200 may have a vacuum chamber comprising EUV plasma source 201 coupled to debris mitigation filter 202. Source 201 emits electromagnetic radiation in many spectral bands including, for example, EUV (from about 1 to 30 nanometers), UV (from about 10 to about 400 nanometers), visible light (from about 360 to 740 nanometers), and infrared (from about 700 to 1000 nanometers). Debris mitigation filter 202 is coupled to collector 203. Filter 202 is used to reduce or substantially eliminate debris from the radiation generation, whereas collector 203 focuses the radiation onto intermediate focal point (IF) 204 before reaching mirror 205. In semiconductor fabrication applications, focal point 204 is the region around which photomasks are positioned during a lithography operation.

Feedback control system 206 need not be disposed within vacuum chamber 200 and comprises spectrometer 209 coupled to detector 208. In one embodiment, spectrometer 209 is a grazing angle (for deep UV spectrum) and/or Czerny-Turner (for UV to IR spectrum) and detector 208 is a charge coupled device such as a backside illuminated camera. Feedback control system may also comprise controller 210 coupled to spectrometer 209 and may be operable to control EUV plasma source 201 using control line 212 as described in more detail below.

In operation, feedback control system 206 receives out-of-band radiation directly from EUV plasma source 201 and from the neighborhood of focal point 204 via optical fibers 211 and 207, respectively. As such, spectrometer 209 may measure out-of-band radiation parameters—e.g., intensity—of out-of-band EUV radiation at source 201 as well as around the region of focal point 204. In one embodiment, a multiplexer (not shown) may be used between detector 208 and fibers 207 and 211 to allow feedback control system 206 to measure each of these signals at a time. In another embodiment, two detectors may be used with a multiplexer coupling them to spectrometer 209 to achieve the same goal. In yet another embodiment, separate spectrometer/detector pairs may be used within feedback control system 206 so that each pair monitors each signal continuously and/or exclusively.

By measuring the out-of-band EUV radiation at source 201 and/or focal point 204, controller 210 is operable to determine anomalies in the absorption and/or attenuation of the out-of band EUV radiation and may control the operation of plasma source 201 accordingly—e.g., the amount of energy being applied to the fuel materials, etc.—via control line 212. In addition, controller 210 may warn an operator of a potential problem with source 201 or halt operation altogether depending upon preset conditions.

In one embodiment controller 210 may be a microprocessor or microprocessor-based device. The software, computer program logic, or code segments implementing various embodiments of the present invention may be stored in a computer readable medium of a computer program product. The term "computer readable medium" includes any physical medium that can store or transfer information. Examples of the computer program products include an electronic circuit, a semiconductor memory device, a ROM, a flash memory, an erasable ROM (EROM), a floppy diskette, a compact disk CD-ROM, an optical disk, a hard disk, and the like. Code segments may be downloaded via computer networks such as the Internet or the like.

Figure 3:
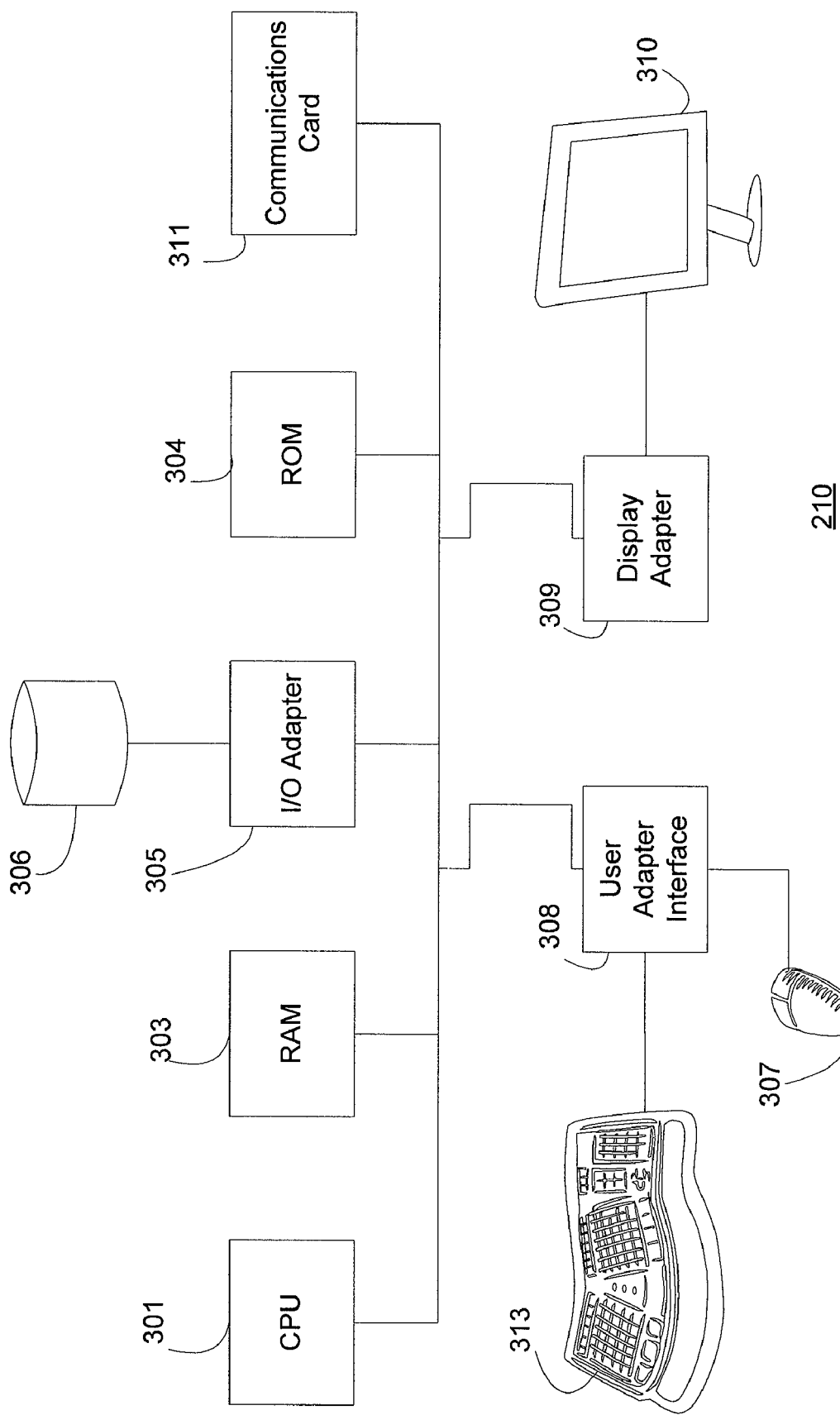
FIG. 3 is a block diagram of a controller according to another embodiment of the present invention.

FIG. 3 is a block diagram further illustrating controller 210 in more detail according to one embodiment of the present invention. Central processing unit ("CPU") 301 is coupled to system bus 302. CPU 301 may be any general purpose CPU. However, embodiments of the present invention are not restricted by the architecture of CPU 301 as long as CPU 301 supports the inventive operations as described herein. Bus 302 is coupled to random access memory ("RAM") 303, which may be SRAM, DRAM, or SDRAM. ROM 304 is also coupled to bus 302, which may be PROM, EPROM, or EEPROM.

Bus 302 is also coupled to input/output ("I/O") controller card 305, communications adapter card 311, user interface card 308, and display card 309. I/O adapter card 305 connects storage devices 306, such as one or more of a hard drive, a CD drive, a floppy disk drive, a tape drive, to controller 210. I/O adapter 305 is also connected to a printer (not shown), to allow the system to print paper copies of information such as documents, photographs, articles, and the like. The printer may be a printer (e.g., dot matrix, laser, and the like), a fax machine, scanner, or a copier machine. Communications card 311 is adapted to couple controller 210 to source 201 and/or spectrometer 209. User interface card 308 couples user input devices, such as keyboard 313, pointing device 307, and the like, to controller 210. Display card 309 is driven by CPU 301 to control the display on display device 310.

Referring back to FIG. 2, controller 210 may use card 311 to establish control line 212 with plasma source 201 and/or to communicate with spectrometer 209 in order to carry out the monitoring and control functions detailed herein. Furthermore, controller 210 may be used to store and/or execute software to implement, for example, method 400 depicted below with respect to FIG. 4.

Figure 4:
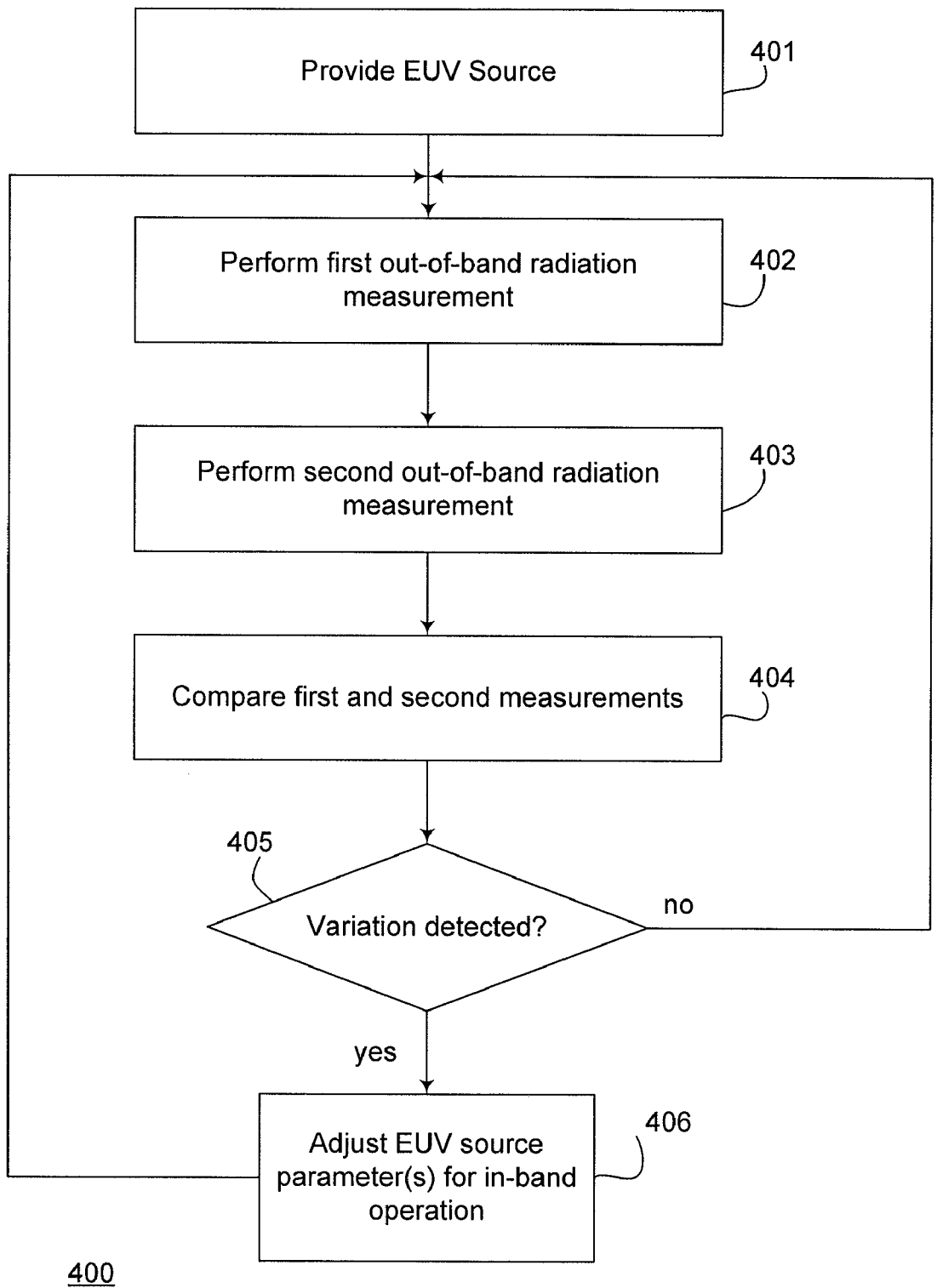
FIG. 4 is a flowchart of a method for monitoring and controlling the in-band operation of extreme ultraviolet (EUV) light sources using out-of-band metrology according to yet another embodiment of the present invention.

Turning now to FIG. 4, a flowchart of method 400 for monitoring and controlling in-band operation of extreme ultraviolet (EUV) sources using out-of-band metrology according to one embodiment of the present invention is depicted. In step 401, plasma source 201 is provided and it is set for operation under normal conditions, for example, during a wafer fabrication process. As noted above, out-of-band EUV radiation has proven to have an unexpectedly high correlation with in-band EUV pulses, and changes in out-of-band radiation are highly indicative of changes in in-band radiation. Therefore, in step 402, feedback control system 206 takes a first measurement of an out-of-band radiation parameter (e.g., intensity). In step 403, feedback control system 206 takes a second measurement of the out-of-band radiation parameter.

The two measurements are compared in step 404. If the second measurement differs from the first measurement by a preset amount (e.g., 1, 2, 5, or 10%), a variation or anomaly is detected in step 405 and controller 210 adjusts source 201 via control line 212 in step 406 to increase stability of EUV source emissions in the in-band EUV spectrum. Otherwise, method 400 returns to step 402. Additionally or alternatively, controller 210 may warn an operator or halt production in step 406 depending upon the degree and/or type of anomaly detected in step 405.

In another embodiment, step 402 measures a first out-of-band radiation parameter at source 201 along with a first out-of-band radiation parameter at focal point 204 and calculates a first attenuation or ratio. In step 403, the same measurements are taken again and a second ratio is calculated. If a subsequent ratio differs from a previous ratio by a pre-determined amount and/or or if current ratios are beyond a pre-set threshold, an anomaly is detected in step 405 and method 400 may proceed similarly as described above. Although the foregoing describes measuring out-of-band EUV radiation at focal point 204, other points within semiconductor fabrication apparatus 200 may also be used.

As a person of ordinary skill in the art will immediately recognize in light of this disclosure, the systems and methods described above provide numerous advantages over the prior art. For example, optical fibers 207 and/or 211 may be placed at any window or flange outside of semiconductor fabrication apparatus 200. Also, off-the-shelf metrology equipment may be used that widely available and well understood by technicians and engineers. Moreover, because these systems need not operate in high vacuum, they provide significant cost savings and much longer lifetime than prior art systems.

Although certain embodiments of the present invention and their advantages have been described herein in detail, it should be understood that various changes, substitutions and alterations can be made without departing from the spirit and scope of the invention as defined by the appended claims. Moreover, the scope of the present invention is not intended to be limited to the particular embodiments of the processes, machines, manufactures, means, methods, and steps described herein. As a person of ordinary skill in the art will readily appreciate from this disclosure, other processes, machines, manufactures, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufactures, means, methods, or steps.

The invention claimed is:

1. A method for monitoring and controlling an operational aspect of an Extreme Ultraviolet (EUV) plasma light source used in a semiconductor fabrication process, the method comprising:
providing a semiconductor fabrication apparatus having a light source that emits in-band and out-of-band radiation;
taking a first out-of-band radiation measurement;
taking a second out-of-band radiation measurement; and
controlling the in-band radiation of the light source, at least in part, based upon a comparison of the first and second out-of-band measurements.

2. The method of claim 1, where taking the first out-of-band radiation measurement comprises detecting out-of-band radiation collected at first point of the semiconductor fabrication apparatus.

3. The method of claim 2, where the first point of the semiconductor fabrication apparatus comprises the light source.

4. The method of claim 2, where taking the second out-of-band radiation measurement comprises detecting out-of-band radiation collected at a second point of the semiconductor fabrication apparatus.

5. The method of claim 4, where the second point of the semiconductor fabrication apparatus comprises an intermediate focal point.

6. The method of claim 1, where detecting out-of-band radiation comprises detecting radiation in a band other than radiation within an EUV band.

7. The method of claim 1, where the in-band radiation is used in the semiconductor fabrication process and the out-of-band radiation is not used in the semiconductor process.

8. The method of claim 6, further comprising correlating the in-band radiation with at least one of the first and second out-of-band radiation measurements.

9. An apparatus for monitoring and controlling the operation of an Extreme Ultraviolet (EUV) plasma source used in a semiconductor fabrication process, the apparatus comprising:
a first electromagnetic detector operable to detect out-of-band EUV radiation emitted by an EUV plasma source;
a second electromagnetic detector operable to detect out-of-band EUV radiation emitted by the EUV plasma source;
a spectrometer coupled to the electromagnetic detector and operable to measure at least one out-of-band radiation parameter based upon the out-of-band EUV radiation detected by the first electromagnetic detector and at least one out-of-band radiation parameter based upon the out-of-band EUV radiation detected by the second electromagnetic detector; and
a controller coupled to the spectrometer and comprising a computer readable medium containing instructions that, when executed, cause the controller to monitor and control the operation of the EUV plasma source based at least in part upon a comparison of the out-of-band radiation parameters measured by the spectrometer.

10. The apparatus of claim 9, where the first electromagnetic detector is operable to detect radiation having a wavelength larger than an EUV wavelength.

11. The apparatus of claim 9, where the EUV plasma source is operated within a vacuum chamber having at least one flange.

12. The apparatus of claim 11, where the first electromagnetic detector is coupled to the at least one flange to detect at least one of:
an out-of-band EUV radiation collected at the EUV plasma source; and
an out-of-band EUV radiation collected at an intermediate focal point.

13. The apparatus of claim 11, where the first electromagnetic detector is coupled to the at least one flange via at least one optical fiber.

14. The apparatus of claim 13, further comprising a multiplexer coupled between the at least one optical fiber and the first electromagnetic detector.

15. The apparatus of claim 13, further comprising:
a multiplexer coupled between first and second electromagnetic detectors and the spectrometer.

16. A computer readable medium having a computer program recorded thereon that causes a computer to perform steps comprising:
monitoring a first out-of-band radiation parameter collected from a first point of a EUV plasma light source apparatus used in a semiconductor fabrication process;
monitoring a second out-of-band radiation parameter collected from a second point of the EUV plasma light source apparatus; and controlling an in-band output of the EUV plasma light source, at least in part, based upon a comparison of first and second out-of-band radiation parameters.

17. The computer readable medium of claim 16, where the computer program further causes the computer to further perform the step of:

correlating the in-band output with at least one of the first and second parameters.

18. The computer readable medium of claim 16, where the computer program further causes the computer to further perform the step of:

alerting an operator if the comparison of first and second out-of-band radiation parameters is beyond a preset threshold.

19. The computer readable medium of claim 16, where the computer program further causes the computer to further perform the step of:

halting operation of the light source apparatus if the comparison of first and second out-of-band radiation parameters is beyond a preset threshold.

* * * * *